United States Patent
Li

(10) Patent No.: US 11,935,320 B2
(45) Date of Patent: Mar. 19, 2024

(54) FINGERPRINT RECOGNIZING DISPLAY PANEL AND FINGERPRINT RECOGNIZING DISPLAY

(71) Applicant: Wuhan China Star Optoelectronics Semiconductor Display Technology Co., Ltd., Hubei (CN)

(72) Inventor: Bo Li, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 222 days.

(21) Appl. No.: 17/266,138

(22) PCT Filed: Nov. 23, 2020

(86) PCT No.: PCT/CN2020/130789
§ 371 (c)(1),
(2) Date: Feb. 5, 2021

(87) PCT Pub. No.: WO2022/073286
PCT Pub. Date: Apr. 14, 2022

(65) Prior Publication Data
US 2022/0309823 A1 Sep. 29, 2022

(30) Foreign Application Priority Data
Oct. 9, 2020 (CN) .......................... 202011072447.1

(51) Int. Cl.
*G06F 3/041* (2006.01)
*G06F 3/044* (2006.01)
(Continued)

(52) U.S. Cl.
CPC ........ *G06V 40/1318* (2022.01); *G06F 3/0412* (2013.01); *G06F 3/04164* (2019.05); *G06F 3/0443* (2019.05); *H10K 59/00* (2023.02)

(58) Field of Classification Search
None
See application file for complete search history.

(56) References Cited

U.S. PATENT DOCUMENTS

| | | | |
|---|---|---|---|
| 9,652,603 B1 | 5/2017 | Lin et al. | |
| 2017/0269756 A1* | 9/2017 | Wang | ............ G06F 3/0446 |
| 2019/0354211 A1* | 11/2019 | Li | ............ H03K 17/9622 |

FOREIGN PATENT DOCUMENTS

| | | |
|---|---|---|
| CN | 104699320 | 6/2015 |
| CN | 104779267 | 7/2015 |

(Continued)

OTHER PUBLICATIONS

Translation of CN 106024836A into English; Wang et al. (Year: 2016).*

(Continued)

*Primary Examiner* — Brian M Butcher

(57) ABSTRACT

A fingerprint recognizing display panel and a fingerprint recognizing display are proposed. The fingerprint recognizing display panel includes a display substrate. The display substrate includes a cathode. A first fingerprint recognizing electrode is arranged on a same layer as the cathode, and a second fingerprint recognizing electrode is arranged vertically aligned to the first fingerprint recognizing electrode. By arranging the first fingerprint recognizing electrode on the same layer as the cathode of the display panel, the display panel is better integrated, and an overall thickness and production cost of the display panel are reduced.

17 Claims, 3 Drawing Sheets

(51) Int. Cl.
*G06V 40/13* (2022.01)
*H10K 59/00* (2023.01)

(56) References Cited

FOREIGN PATENT DOCUMENTS

| CN | 106024836 | 10/2016 |
| CN | 206601913 | 10/2017 |
| CN | 108493201 | 9/2018 |
| CN | 108711406 | 10/2018 |
| CN | 109062430 | 12/2018 |
| CN | 109300941 | 2/2019 |
| CN | 109801950 | 5/2019 |
| CN | 208938076 | 6/2019 |
| CN | 110007799 | 7/2019 |
| CN | 110427121 | 11/2019 |

OTHER PUBLICATIONS

Translation of CN 104779267A into English; Cao (Year: 2015).*
Notification of Office Action and Search Report dated May 6, 2023 From the State Intellectual Property Office of the People's Republic of China Re. Application No. 202011072447.1 and Its Translation Into English. (25 Pages).

* cited by examiner

FINGERPRINT RECOGNIZING DISPLAY PANEL AND FINGERPRINT RECOGNIZING DISPLAY

RELATED APPLICATIONS

This application is a National Phase of PCT Patent Application No. PCT/CN2020/130789 having International filing date of Nov. 23, 2020, which claims the benefit of priority of Chinese Patent Application No. 202011072447.1 filed on Oct. 9, 2020. The contents of the above applications are all incorporated by reference as if fully set forth herein in their entirety.

FIELD AND BACKGROUND OF THE INVENTION

The application relates to display technology, in particular to a fingerprint recognizing display panel and a fingerprint recognizing display applying the fingerprint recognizing display panel.

Fingerprint recognition technology has been widely used in mobile phones, notebook computers, attendance machines, and other fields for the nature of security and convenience. Most current fingerprint recognizing devices, however, are based on independent fingerprint modules. The fingerprint recognition modules most adopted in current mobile phones can be categorized into three technical types. Firstly, a front independent button type module is characterized by ease of use, but installation thereof has considerable impacts on a screen-to-body ratio of the mobile phone. Secondly, a button type module is placed on a back or side of the mobile phone. Since users cannot see a position of the module, they have to feel their way around the mobile phone when fingerprint unlocking is required, which may downgrade user experience. An on-screen fingerprint recognition technology has emerged in recent years, and is regarded as the third type that has overcome the disadvantages of the first two types. Such on-screen fingerprint recognition is implemented by attaching an independent optical or ultrasonic module under a screen, which may add considerable thickness to a display that is inconvenient to mechanical design and also increases production cost.

Therefore, the thickness and cost issues rendered by the current on-screen fingerprint recognition technology are to be solved.

SUMMARY OF THE INVENTION

In order to solve the above technical problems, the solution provided by the application is as follows.

An embodiment of a fingerprint recognizing display panel having a display area, comprises a display substrate, a first fingerprint recognizing electrode, and a second fingerprint recognizing. The display substrate comprises a cathode arranged in the display area. The first fingerprint recognizing electrode is arranged on a same layer as the cathode in the display area. The second fingerprint recognizing electrode is arranged in the display area, vertically aligned to the first fingerprint recognizing electrode.

The first fingerprint recognizing electrode may comprise a first electrode block and a first electrode line electrically connected with the first electrode block, and the first electrode line is extendable along a first direction.

The fingerprint recognizing display panel may further comprise a plurality of first fingerprint recognizing electrodes arranged in parallel to each other.

The second fingerprint recognizing electrode may comprise a second electrode block and a second electrode line electrically connected with the second electrode block, and the second electrode line extends along a second direction.

The fingerprint recognizing display panel may further comprise a plurality of second fingerprint recognizing electrodes arranged in parallel to each other, wherein the first electrode block and the second electrode block are vertically aligned.

The first electrode block may be in a shape of polygon or circle.

The second electrode block may be in a shape of polygon or circle.

The fingerprint recognizing display panel may further comprise a film packaging layer covering the cathode and the first fingerprint recognizing electrode; wherein the second fingerprint recognizing electrode is arranged on the film packaging layer.

The fingerprint recognizing display panel may further comprise a touch electrode arranged on the film packaging layer, wherein the touch electrode provides a touch function for the fingerprint recognizing display panel.

The touch electrode may comprise a touch electrode block and a touch electrode wire electrically connected with the touch electrode block.

The first electrode block and the second electrode block may be both smaller than the touch electrode block in size.

The touch electrode may comprise a first touch electrode, a second touch electrode and a bridging electrode. The first touch electrode is separated by the second touch electrode on their intersected area, and the separated first touch electrodes on both sides of the second touch electrode are electrically connected through the bridging electrode.

The first touch electrode, the second touch electrode and the second fingerprint recognizing electrode are all located on the same layer of the fingerprint recognizing display panel.

The fingerprint recognizing display panel may further comprise a first passivation layer above the first touch electrode, the second touch electrode and the second fingerprint recognizing electrode. The bridging electrode is arranged on the first passivation layer, electrically connected with the first touch electrode through a via hole on the first passivation layer.

The fingerprint recognizing display panel may further comprise a second passivation layer and a fingerprint recognition lead. The second passivation layer is arranged above the first passivation layer, and the bridging electrode and the fingerprint recognition lead are arranged on the second passivation layer.

The first fingerprint recognizing electrode and the cathode may be made of the same conductive material, and the second fingerprint recognizing electrode may be made of a three-layer composite structure of indium tin oxide, silver, and indium tin oxide.

The display substrate may further comprise: a base substrate; an array layer arranged on the base substrate, and a light emitting layer arranged on the array layer; wherein the cathode and the first fingerprint recognizing electrode are arranged on the light emitting layer.

Another embodiment provides a fingerprint recognizing display comprising the fingerprint recognizing display panel. The fingerprint recognizing display panel has a display area, and comprising: a display substrate comprising a cathode arranged in the display area; a first fingerprint recognizing electrode arranged in the display area and on a same layer as the cathode; and a second fingerprint recognizing electrode arranged in the display area, vertically aligned to the first fingerprint recognizing electrode. The first fingerprint recognizing electrode may comprise a first electrode block and a first electrode line electrically connected with the first electrode block, and the second fingerprint recognizing electrode may comprise a second electrode block and a second electrode line electrically connected with the second electrode block. The fingerprint recognizing display may further comprise a touch electrode. The touch electrode may comprise a touch electrode block and a touch electrode wire electrically connected with the touch electrode block. The first electrode block and the second electrode block are both smaller than the touch electrode block in size.

The fingerprint recognizing display panel and fingerprint recognizing display provided by the embodiments has a fingerprint recognizing electrode for realizing fingerprint recognition function and a touch electrode for sensing touches. By arranging the first fingerprint recognizing electrode in the fingerprint recognizing electrode and the cathode of the display panel on the same layer, the problem of prior arts where the cathode signal causes interferences to fingerprint recognizing electrodes vertically aligned in the same area is overcame. The accuracy and sensitivity of fingerprint recognition are significantly improved. Moreover, the fingerprint recognizing electrode in the application is integrated on both sides of the film packaging layer, which improves the integration of the fingerprint recognizing electrode and the display panel, and reduces the overall thickness and production cost of the display panel compared with the prior art.

BRIEF DESCRIPTION OF THE SEVERAL VIEWS OF THE DRAWINGS

To explain the embodiments with more detail, the drawings accompanied with the embodiments are hereby presented.

DESCRIPTION OF SPECIFIC EMBODIMENTS OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

An embodiment of the application proposes a fingerprint recognizing display panel and a fingerprint recognizing display. The fingerprint recognizing display panel comprises a fingerprint recognizing electrode for recognizing fingerprints, and a touch electrode for sensing touches. By deploying the first fingerprint recognizing electrode in the fingerprint recognizing electrode and the cathode of the display panel on the same layer, the interference caused by the cathode when recognizing fingerprints in the prior art is mitigated. In addition, the fingerprint recognizing electrode in the application is integrated on both sides of the film packaging layer, which improves the integration of the fingerprint recognizing electrode and the display panel, and reduces the overall thickness and production cost of the display panel compared with the prior art.

Figure 1:
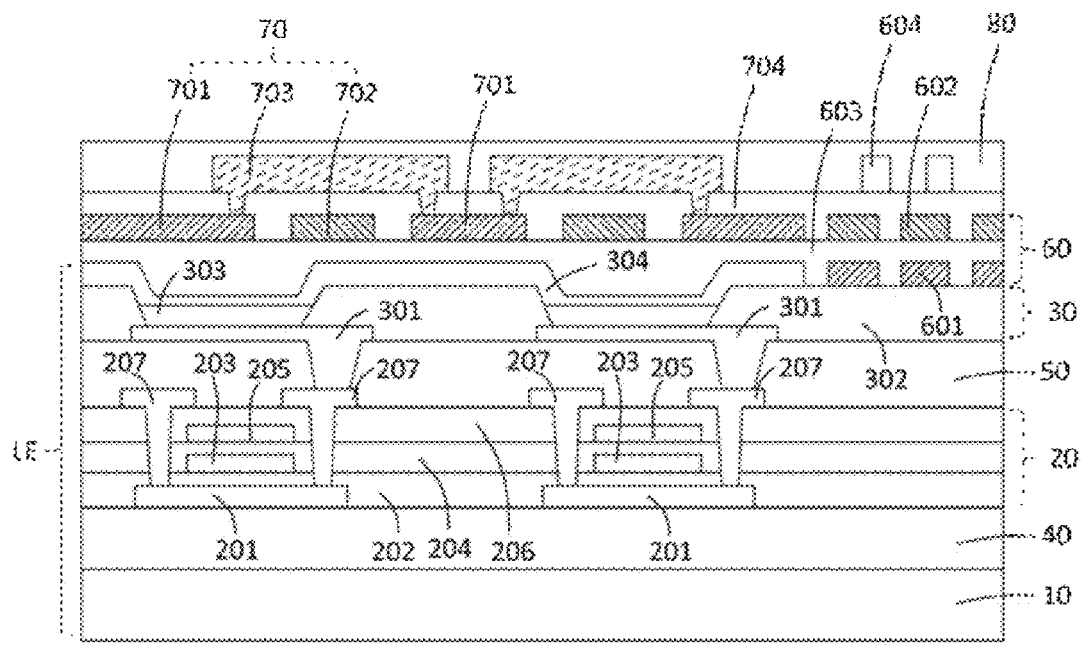
FIG. 1 is a cross-sectional structure diagram of a fingerprint recognizing display panel according to an embodiment of the application.

In FIG. 1, a cross-sectional structure diagram of the fingerprint recognizing display panel is presented according to an embodiment of the application. It is to be noted that the fingerprint recognizing display panel has a display area and a non-display area. The display area undertakes the display function of the fingerprint recognizing display panel, and the non-display area is configured to deploy a variety of edge lines and devices, so as to provide various power and control signals for the display area to function as expected.

The fingerprint recognizing display panel comprises a display substrate LE. A fingerprint recognizing electrode 60 and a touch electrode 70 are arranged on the display substrate LE, wherein the fingerprint recognizing electrode 60 includes a first fingerprint recognizing electrode 601 and a second fingerprint recognizing electrode 602, and the first fingerprint recognizing electrode 601 and the second fingerprint recognizing electrode 602 are arranged with vertical alignment so as to perform fingerprint recognition. It should be noted that the display substrate LE is a component in the fingerprint recognizing display panel that renders the display function, which also has a display area and a non-display area corresponding to the fingerprint recognizing display panel. The fingerprint recognizing electrode 60 is arranged on the display substrate LE, and specifically, the fingerprint recognizing electrode 60 is arranged in the display area to enable fingerprint recognition. On the one hand, it is convenient for the user to find the fingerprint recognizing area accurately, and the smoothness and comfort of use are improved. Furthermore, it is conducive to improve the screen-to-body ratio of the display area.

Further, the display substrate LE comprises a cathode 304 corresponding to the display area of the display substrate LE. The cathode 304 can be an integral metal electrode or a metal oxide electrode, configured to deliver power and control signals for the display substrate LE to work.

The first fingerprint recognizing electrode 601 is arranged on the same layer as the cathode 304, and the first fingerprint recognizing electrode 601 does not overlap with the cathode 304. Alternatively, the first fingerprint recognizing electrode 601 and the cathode 304 are made of the same material. It is to be noted that when the first fingerprint recognizing electrode 601 and the cathode 304 are made of the same material, the same coating process can be used together with the cathode 304 to form the original conductive layer during the production process of the first fingerprint recognizing electrode 601. Thereafter in the pattern recognition area, the original conductive layer is processed to form the first fingerprint recognizing electrode 601 through a specific patterning process, so that no separate coating operation is needed for the production of the first fingerprint recognizing electrode 601, which simplifies the overall manufacturing process of the fingerprint recognizing display panel and reduces the production cost.

Figure 2:
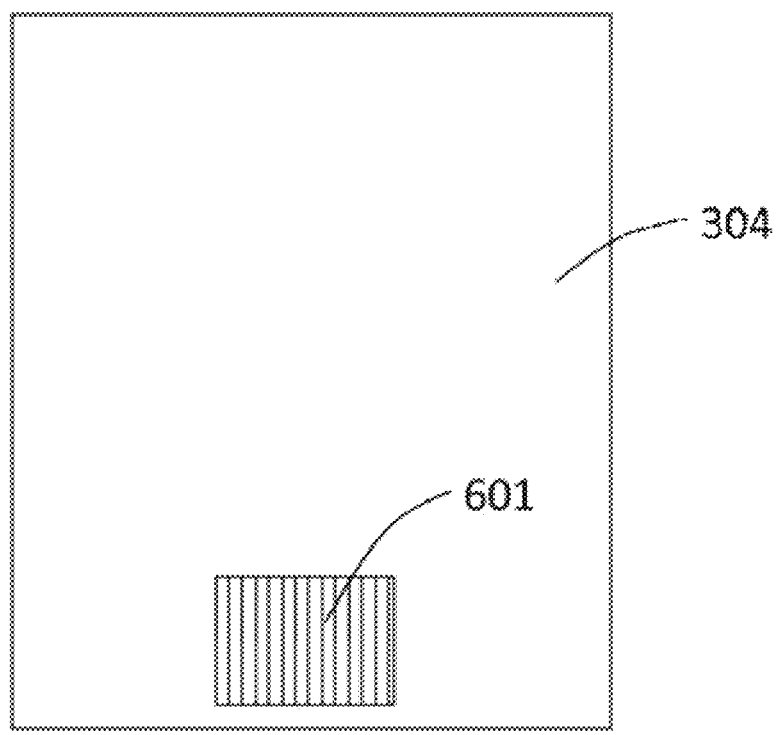
FIG. 2 is a perspective view of a cathode layer of the fingerprint recognizing display panel according to an embodiment of the application.

Please refer to FIG. 1 and FIG. 2, wherein FIG. 2 is a perspective view of the cathode layer of the fingerprint recognizing display panel according to an embodiment of the application. In the embodiment, the area where the first fingerprint recognizing electrode 601 is located is surrounded by the cathode 304 and is located at one edge of an area surrounded by the cathode 304. It is to be noted that the area where the first fingerprint recognizing electrode 601 is located is the fingerprint recognizing area in the fingerprint recognizing display panel, and the area where the first fingerprint recognizing electrode 601 is located is not limited to the present embodiment. A person skilled in the art can freely select the placement position of the first fingerprint recognizing electrode 601 according to the actual needs and the user habits, and the size of the display area occupied by the first fingerprint recognizing electrode 601 is not limited. It can also be freely selected according to the actual design requirements and user preferences.

In the embodiment of the application, the first fingerprint recognizing electrode 601 and the cathode 304 are arranged on the same layer, and there is no overlap between the two in the thickness direction of the fingerprint recognizing display panel, which effectively mitigates the disadvantages in a conventional design wherein the cathode overlapped on the fingerprint recognizing electrode interferes the fingerprint recognition. Moreover, it is advantageous to arrange the first fingerprint recognizing electrode 601 and the cathode 304 on the same layer, so that the thickness of the display panel occupied by the fingerprint recognizing electrode 60 is reduced, allowing lightweight design of the fingerprint recognizing display panel.

The second fingerprint recognizing electrode 602 and the first fingerprint recognizing electrode 601 are arranged on adjacent layers with vertical alignment. The first fingerprint recognizing electrode 601 and the second fingerprint recognizing electrode 602 jointly constitute the upper and lower electrodes of the fingerprint recognizing electrode 60. Alternatively, the first fingerprint recognizing electrode 601 constitutes a driving electrode of the fingerprint recognizing electrode 60. During fingerprint recognition, the first fingerprint recognizing electrode 601 provides an active detection signal to form a stable capacitance between the first fingerprint recognizing electrode 601 and the second fingerprint recognizing electrode 602. The second fingerprint recognizing electrode 602 serves as a sensor electrode of the fingerprint recognizing electrode 60. During a fingerprint recognition operation, the second fingerprint recognizing electrode 602 senses the pressure change in the fingerprint recognizing area, so that the stability of the capacitance formed between the first fingerprint recognizing electrode 601 and the second fingerprint recognizing electrode 602 is broken, and an electric signal generated by the capacitance change is transmitted to a processor unit to extract fingerprint information therefrom, such that fingerprints are recognized.

Specifically, the first fingerprint recognizing electrode 601 and the cathode 304 are covered by the film packaging layer 603, and the first fingerprint recognizing electrode 601 and the second fingerprint recognizing electrode 602 are respectively located on the opposite sides of the film packaging layer 603. The film packaging layer 603 is an isolation layer that may be made from an organic layer, an inorganic layer, or a combination of the organic layer and the inorganic layer, providing physical isolation to all kinds of components within the display substrate LE.

Alternatively, the second fingerprint recognizing electrode 602 can be a transparent metal electrode or a transparent metal oxide electrode, or a transparent electrode composed of a metal electrode and a metal oxide electrode. For example, the second fingerprint recognizing electrode 602 can be made of a three-layer composite structure of indium tin oxide, silver, and indium tin oxide, so that the second fingerprint recognizing electrode 602 features good transmittance and excellent conductivity.

Figure 3:
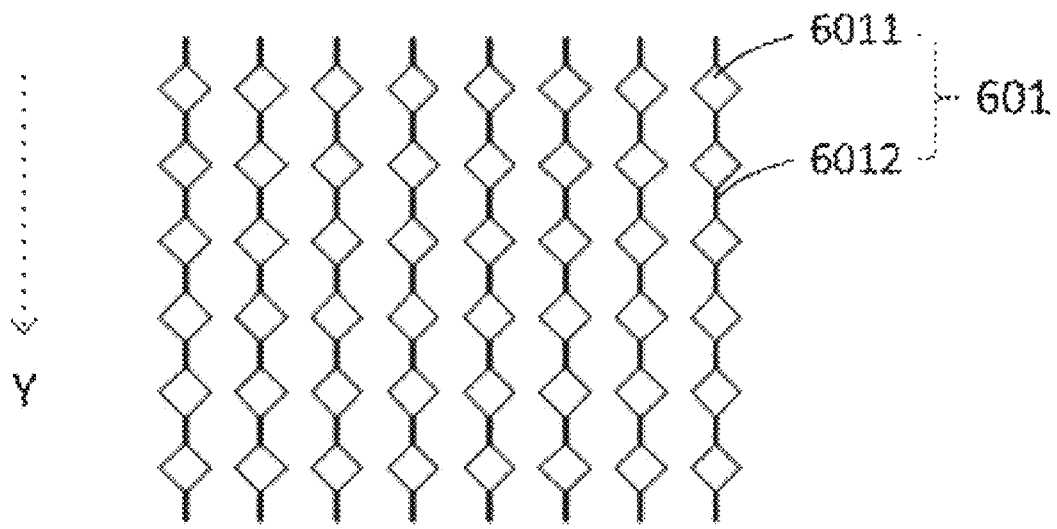
FIG. 3 is a structural diagram of a first fingerprint recognizing electrode according to an embodiment of the application.
Figure 4:
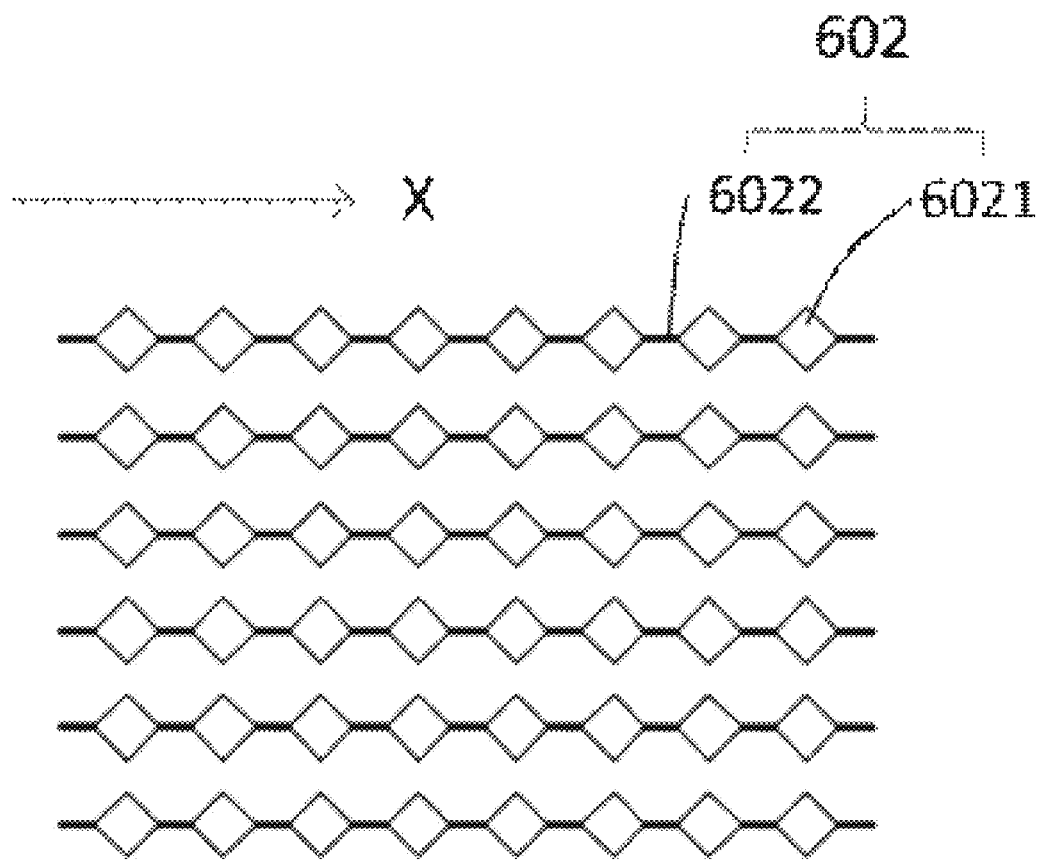
FIG. 4 is a structural diagram of a second fingerprint recognizing electrode according to an embodiment of the application.

Please refer to FIG. 1, FIG. 3, and FIG. 4, wherein FIG. 3 is the structural diagram of the first fingerprint recognizing electrode according to an embodiment of the application, and FIG. 4 is the structural schematic diagram of the second fingerprint recognizing electrode according to an embodiment of the application. In one embodiment, the first fingerprint recognizing electrode 601 includes a first electrode block 6011 and a first electrode line 6012 electrically connected with the first electrode block 6011, and the first electrode line 6012 extends along the first direction Y. The second fingerprint recognizing electrode 602 includes a second electrode block 6021 and a second electrode line 6022 electrically connected with the second electrode block 6021, and the second electrode line 6022 extends along the second direction X. Through the above design, the first fingerprint recognizing electrode 601 intersects with the arrangement direction of the second fingerprint recognizing electrode 602, dividing the fingerprint recognizing area into a grid shape which refines the fingerprint recognizing area, and improves the sensitivity and accuracy of fingerprint recognition.

Alternatively, the fingerprint recognizing display panel comprises a plurality of first fingerprint recognizing electrodes 601 and a plurality of second fingerprint recognizing electrodes 602, and the plurality of first fingerprint recognizing electrodes 601 are parallel to each other and cover the entire fingerprint recognizing area, and the plurality of second fingerprint recognizing electrodes 602 are parallel to each other and cover the entire fingerprint recognizing area. It is to be noted that each of the first electrode lines 6012 and the first electrode block 6011 connected in series constitute the first fingerprint recognizing electrode 601, and each of the second electrode lines 6022 and the second electrode block 6021 connected in series constitute a second fingerprint recognizing electrode 602. Through the above design, the fingerprint recognizing electrodes are distributed all around the fingerprint recognizing area, hence the sensitivity and accuracy of fingerprint recognition are improved.

Alternatively, the first electrode block 6011 may be in a shape of polygonal or circle, and likewise, the second electrode block 6021 may also be in a shape of polygonal or circle. For example, the shape of the first electrode block 6011 and the shape of the second electrode block 6021 can be a regular triangle, a rhombic shape, a regular pentagon, etc.

Figure 5:
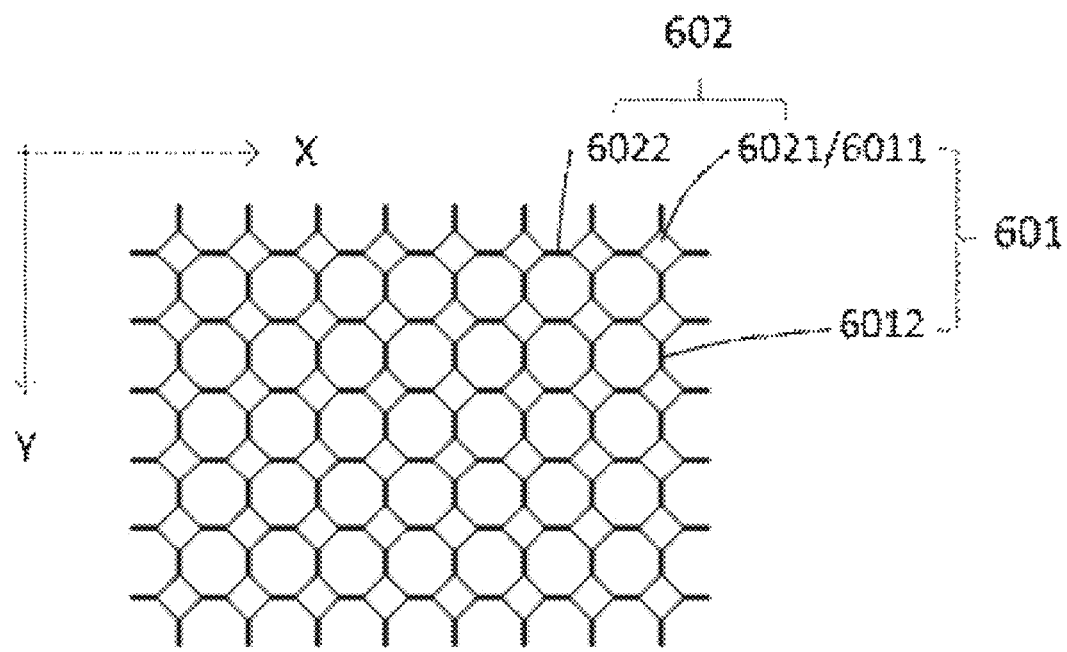
FIG. 5 is a perspective view of a laminated structure of the first fingerprint recognizing electrode and the second fingerprint recognizing electrode according to an embodiment of the application.

Please refer to FIG. 1 and FIG. 5, wherein FIG. 5 is a perspective view of the laminated structure of the first fingerprint recognizing electrode 601 and the second fingerprint recognizing electrode 602 according to an embodiment of the application. In one embodiment, the first electrode block 6011 is overlapped with the second electrode block 6021, and the first fingerprint recognizing electrode 601 is arranged along the first direction Y. The second fingerprint recognizing electrode 602 is arranged along the second direction X, and the first fingerprint recognizing electrode 601 intersects with the second fingerprint recognizing electrode 602 so that the fingerprint recognizing electrode 60 forms a network electrode matrix for fingerprint positioning and recognizing. Alternatively, the first fingerprint recognizing electrode 601 is perpendicular to the second fingerprint recognizing electrode 602, and the first electrode block 6011 and the second electrode block 6021 are overlapped at their vertical intersections, forming an electrode matrix of grids for recognizing fingerprints with improved sensitivity and accuracy.

The fingerprint recognizing display panel according to the embodiment of the application is capable of recognizing fingerprints in the screen. By arranging the first fingerprint recognizing electrode on the same layer as the cathode of the display panel, the disadvantages in the prior art, interferences caused by the cathode overlapped over the fingerprint recognizing electrode when recognizing fingerprints, can no longer happen. The sensitivity and accuracy of on-screen fingerprint recognition are also improved. The two poles of the fingerprint recognizing electrode are integrated on both sides of the film packaging layer, thereby improving the integration of the fingerprint recognizing electrode and the display panel, and reducing the overall thickness and production cost of the display panel.

Referring to FIG. 1, one embodiment of the fingerprint recognizing display panel also includes a touch electrode 70 arranged on the film packaging layer 603, and the touch electrode 70 is configured to detect touches on the fingerprint recognizing display panel. Specifically, the touch electrode 70 includes a first touch electrode 701 and a second touch electrode 702. The first touch electrode 701 and the second touch electrode 702 are arranged on the same layer of the fingerprint recognizing display panel. The two touch electrodes intersect in their respective extension directions, but are insulated from each other. The first touch electrode 701 is separated into two sides when intercrossing the second touch electrode 702. The first touch electrode 701 on both sides of the second touch electrode 702 are electrically connected through the bridging electrode 703, so that the first touch electrode 701 forms a complete electrode throughout the whole display area of the fingerprint recognizing display panel.

Furthermore, the second fingerprint recognizing electrode 602, the first touch electrode 701 and the second touch electrode 702 are all located on the same layer of the fingerprint recognizing display panel, and the first touch electrode 701 and the second touch electrode 702 can be made of the same material as the second fingerprint recognizing electrode 602. It is to be noted that when the first touch electrode 701, the second touch electrode 702, and the second fingerprint recognizing electrode 602 are made of the same material, the same coating process can be used to jointly form the original conductive layers of the three electrodes, and then the original conductive layers are processed by the pattern chemical process to respectively form the second fingerprint recognizing electrode 602, the first touch electrode 701, and the second touch electrode 702, thereby simplifying the overall manufacturing process of the fingerprint recognizing display panel and reducing the production cost. Furthermore, the embodiment of the application does not need to set a separate film layer structure for the first touch electrode 701 and the second touch electrode 702, which is conducive to further reducing the overall thickness of the fingerprint recognizing display panel while integrating touch sensing together with fingerprint recognition in the fingerprint recognizing display panel, allowing lightweight design of the fingerprint recognizing display panel.

Furthermore, a first passivation layer 704 is arranged over the first touch electrode 701, the second touch electrode 702, and the second fingerprint recognizing electrode 602. The first passivation layer 704 is an insulating layer. A bridging electrode 703 is arranged on the first passivation layer 704, and is electrically connected with the first touch electrode 701 through a via hole on the first passivation layer 704. Alternatively, the first passivation layer 704 is also provided with a fingerprint recognition lead 604, which is electrically connected with the first fingerprint recognizing electrode 601 and/or the second fingerprint recognizing electrode 602, and is used for the transmission of driving signals and induction signals to connect the first fingerprint recognizing electrode 601 and/or the second fingerprint recognizing electrode 602 with an external processor unit. Alternatively, the fingerprint recognition lead 604 is made of a material with a titanium/aluminum/titanium three-layer conductive metal layer to ensure that the fingerprint recognition lead 604 has a low impedance and further improve the accuracy and sensitivity of fingerprint recognition.

Figure 6:
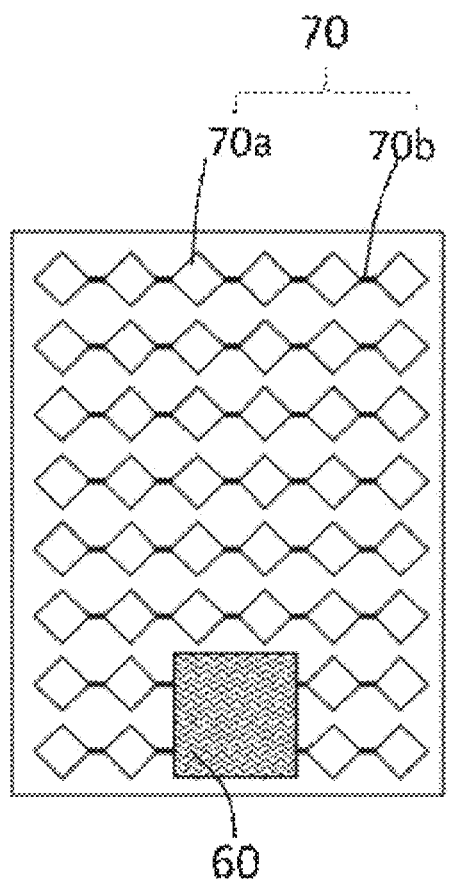
FIG. 6 is a perspective view of a fingerprint recognizing display panel on a touch electrode layer according to an embodiment of the application.

Please refer to FIG. 1, FIG. 5, and FIG. 6, wherein FIG. 6 is the perspective view of the fingerprint recognizing display panel provided by the embodiment of the application on the touch electrode layer. In one embodiment, the touch electrode 70 includes a touch electrode block 70a and a touch electrode wire 70b electrically connected with the touch electrode block 70a. The touch electrode block 70a and the touch electrode wire 70b are arranged in the same layer as the second fingerprint recognizing electrode 602. The size of the first electrode block 6011 in the first fingerprint recognizing electrode 601 and the size of the second electrode block 6021 in the second fingerprint recognizing electrode 602 are both smaller than the size of the touch electrode block 70a. It is to be noted that the size of the first electrode block 6011 can refer to the perimeter of the first electrode block 6011 or the length of a characteristic edge of the first electrode block 6011. For example, when the shape of the first electrode block 6011 is round, the size thereof is referred to as the circumference or radius of the circle. When the shape of the first electrode block 6011 is rhombic, the size is referred to as the circumference or side length of the diamond. Likewise, the size of the second electrode block 6021, the size of the touch electrode block 70a, and the size of the first electrode block 6011 may all be referred to the same properties of dimensions, for example, length of an edge, radius of a circle, or the circumference.

Alternatively, the shape of the first electrode block 6011, the shape of the second electrode block 6021, and the shape of the touch electrode block 70a may all be rhombic. The side lengths of the first electrode block 6011 and the second electrode block 6021 are less than 70 μm, and the edge length of the touch electrode block 70a is greater than 3 mm.

It is to be noted that the size of the electrode block is directly related to the accuracy of touch or fingerprint recognition, regardless of a touch electrode or a fingerprint recognizing electrode. Specifically, when the size of an electrode block is smaller, the accuracy of touch sensing or fingerprint recognition is higher, but the production cost is also higher. In the embodiment of the application, the size of the first electrode block 6011 and the second electrode block 6021 are smaller than the size of the touch electrode block 70a, which is conducive to precision improvement of fingerprint recognition and optimization of production cost.

Referring to FIG. 1, the fingerprint recognizing display panel also includes a second passivation layer 80 arranged on the bridge electrode 703 and the fingerprint recognition lead 604. The second passivation layer 80 serves as an electrical insulation and physical protection, such as preventing abrasion and water vapor erosion.

In one embodiment, the display substrate LE is an organic light emitting diode display substrate, including a base substrate 10, a buffer layer 40 arranged on the base substrate 10, an array layer 20 arranged on the buffer layer 40, a flat layer 50 arranged on the array layer 20, and a light emitting layer 30 arranged on the flat layer 50. Specifically, the base substrate 10 may include insulating materials, such as polyimide, glass, quartz, or ceramics, etc. The buffer layer 40 is arranged on the base substrate 10, and the buffer layer 40 may include a variety of organic materials or inorganic materials. The array layer 20 includes a semiconductor layer 201, a first gate insulating layer 202, a first gate 203, a second gate insulating layer 204, a second gate 205, an interlayer insulating layer 206, and a source drain electrode 207. The semiconductor layer 201 is arranged on the buffer layer 40, and the substrate material of the semiconductor layer 201 can be N-type or P-type polysilicon semiconductor or metal oxide semiconductor. The first gate insulating layer 202 is arranged on the semiconductor layer 201, and the material can be insulating materials including silicon nitride, silicon oxide, etc. The first gate 203 is arranged on the first gate insulating layer 202. The material of the first gate 203 can be metal material Mo, and the semiconductor layer 201 can be divided into a source electrode, a channel part, and a drain electrode. The first gate 203 and the source, channel, and drain of the semiconductor layer 201 constitute the gate, source, and drain of the low-temperature polysilicon transistor or metal oxide transistor. The second gate insulating layer 204 is arranged on the first gate 203, and its material can be silicon nitride or silicon oxide and other insulating materials. The second gate 205 is arranged on the second gate insulating layer 204, and the material can be metal Mo. The second gate 205 and the first gate 203 form the upper and lower electrodes of the storage capacitor. The interlayer insulating layer 206 is covered on the second gate 205, made of insulation materials such as silicon nitride or silicon oxide. The source drain electrode 207 is arranged on the interlayer insulating layer 206, and the material is one or more of gold, silver, copper, lithium, sodium, potassium, magnesium, aluminum, zinc, and their combination, and the source drain electrode 207 is electrically coupled to the source electrode and drain electrode of the semiconductor layer 201 through a via hole on the interlayer insulating layer 206, the second gate insulating layer 204 and the first gate insulating layer 202. The flat layer 50 is arranged on the source drain electrode 207, made of silicon nitride or silicon oxide and other insulating materials. The light emitting layer 30 includes an anode 301, a pixel definition layer 302, an organic function layer 303, and a cathode 304. The anode 301 is arranged on the flat layer 50, and the material is a combination of ITO and Ag, and the anode 301 is electrically coupled to the source drain electrode 207 through an opening of the flat layer 50. The pixel definition layer 302 is arranged on the anode 301. The pixel definition layer 302 is provided with a plurality of openings. The organic function layer 303 is in contact with the anode 301 through the opening of the pixel definition layer 302, and the cathode 304 is arranged on the pixel definition layer 302, coupled to the organic functional layer 303 through the openings on the pixel definition layer 302.

A further embodiment of the application also provides a fingerprint recognizing display, which comprises a fingerprint recognizing display panel described in the aforementioned embodiments. The fingerprint recognition display can be a mobile phone, a tablet computer, a notebook computer, a television, a navigator, etc.

To sum up, the fingerprint recognizing display panel and fingerprint recognizing display provided by the embodiments of the application include a fingerprint recognizing electrode for fingerprint recognition and a touch electrode for sensing touches. By arranging the first fingerprint recognizing electrode in the fingerprint recognizing electrode and the cathode of the display panel on the same layer, the problem in prior arts, that is, interferences caused by the cathode arranged above the fingerprint recognizing electrode, are solved. The solution is also conducive to improving the accuracy and sensitivity of fingerprint recognition. Moreover, the fingerprint recognizing electrode in the application is integrated on both sides of the film packaging layer, which improves the integration of the fingerprint recognizing electrode and the display panel, and reduces the overall thickness and production cost of the display panel compared with the prior art.

It is to be noted that although the application discloses the above by specific embodiments, the above embodiments are not intended to limit the application. Ordinary technical personnel in the art can make various changes and refinements without departing from the spirit and scope of the application. Therefore, the scope of protection of the application is subject to the scope defined in the claims.

What is claimed is:

1. A fingerprint recognizing display panel having a display area, comprising:
   a display substrate, comprising a cathode arranged in the display area;
   a first fingerprint recognizing electrode, arranged on a same layer as the cathode in the display area;
   a second fingerprint recognizing electrode, arranged in the display area, vertically aligned to the first fingerprint recognizing electrode; and
   a touch electrode arranged in a same layer as the second fingerprint recognizing electrode, wherein the touch electrode provides a touch function for the fingerprint recognizing display panel,
   wherein the first fingerprint recognizing electrode comprises a first electrode block and a first electrode line electrically connected with the first electrode block; the second fingerprint recognizing electrode comprises a second electrode block and a second electrode line electrically connected with the second electrode block; the touch electrode comprises a touch electrode block and a touch electrode wire electrically connected with the touch electrode block; and the first electrode block and the second electrode block are both smaller than the touch electrode block in size.

2. The fingerprint recognizing display panel according to claim 1, wherein:
   the first electrode line extends along a first direction.

3. The fingerprint recognizing display panel according to claim 2, further comprising a plurality of first fingerprint recognizing electrodes arranged in parallel to each other.

4. The fingerprint recognizing display panel according to claim 2, wherein the second electrode line extends along a second direction.

5. The fingerprint recognizing display panel according to claim 4, further comprising a plurality of second fingerprint recognizing electrodes arranged in parallel to each other.

6. The fingerprint recognizing display panel according to claim 4, wherein the first electrode block and the second electrode block are vertically aligned.

7. The fingerprint recognizing display panel according to claim 2, wherein the first electrode block is in a shape of polygon or circle.

8. The fingerprint recognizing display panel according to claim 4, wherein the second electrode block is in a shape of polygon or circle.

9. The fingerprint recognizing display panel according to claim 4, further comprising a film packaging layer covering the cathode and the first fingerprint recognizing electrode, wherein the second fingerprint recognizing electrode is arranged on the film packaging layer.

10. The fingerprint recognizing display panel according to claim 9, wherein:
the touch electrode comprises a first touch electrode, a second touch electrode, and a bridging electrode;
the first touch electrode is separated by the second touch electrode on their intersected area; and
the separated first touch electrodes on both sides of the second touch electrode are electrically connected through the bridging electrode.

11. The fingerprint recognizing display panel according to claim 10, further comprising a first passivation layer above the first touch electrode, the second touch electrode, and the second fingerprint recognizing electrode; wherein:
the bridging electrode is arranged on the first passivation layer, electrically connected with the first touch electrode through a via hole on the first passivation layer.

12. The fingerprint recognizing display panel according to claim 10, further comprising a first passivation layer above the first touch electrode, a second passivation layer and a fingerprint recognition lead; wherein:
the second passivation layer is arranged above the first passivation layer; and
the bridging electrode and the fingerprint recognition lead are arranged on the second passivation layer.

13. The fingerprint recognizing display panel according to claim 1, wherein:
the first fingerprint recognizing electrode and the cathode are made of a same conductive material; and
the second fingerprint recognizing electrode is made of a three-layer composite structure of indium tin oxide, silver, and indium tin oxide.

14. The fingerprint recognizing display panel according to claim 1, wherein the display substrate further comprises:
a base substrate;
an array layer arranged on the base substrate; and
a light emitting layer arranged on the array layer;
wherein the cathode and the first fingerprint recognizing electrode are arranged on the light emitting layer.

15. A fingerprint recognizing display comprising a fingerprint recognizing display panel, wherein:
the fingerprint recognizing display panel has a display area, and comprises:
a display substrate comprising a cathode arranged in the display area;
a first fingerprint recognizing electrode arranged in the display area and on a same layer as the cathode;
a second fingerprint recognizing electrode arranged in the display area, vertically aligned to the first fingerprint recognizing electrode; and
a touch electrode arranged in a same layer as the second fingerprint recognizing electrode, wherein the touch electrode provides a touch function for the fingerprint recognizing display panel,
wherein the first fingerprint recognizing electrode comprises a first electrode block and a first electrode line electrically connected with the first electrode block; the second fingerprint recognizing electrode comprises a second electrode block and a second electrode line electrically connected with the second electrode block; the touch electrode comprises a touch electrode block and a touch electrode wire electrically connected with the touch electrode block; and the first electrode block and the second electrode block are both smaller than the touch electrode block in size.

16. The fingerprint recognizing display panel according to claim 1, wherein the second fingerprint recognizing electrode and the touch electrode are made of a same material.

17. The fingerprint recognizing display according to claim 15, wherein the second fingerprint recognizing electrode and the touch electrode are made of a same material.

\* \* \* \* \*